United States Patent [19]
Chun

[11] Patent Number: 5,666,074
[45] Date of Patent: Sep. 9, 1997

[54] SENSE AMPLIFIER POWER SUPPLY CIRCUIT

[75] Inventor: Jun-Hyun Chun, Cheongju-si, Rep. of Korea

[73] Assignee: LG Semicon Co., Ltd., Cheongju, Rep. of Korea

[21] Appl. No.: 648,276

[22] Filed: May 15, 1996

[30] Foreign Application Priority Data

Sep. 15, 1995 [KR] Rep. of Korea .................. 95-30188

[51] Int. Cl.⁶ .................................................. G01R 19/00
[52] U.S. Cl. ............................ 327/51; 327/538; 365/226
[58] Field of Search ........................... 327/51–57, 530, 327/538, 543–546, 379; 365/226, 228

[56] References Cited

U.S. PATENT DOCUMENTS

| | | | |
|---|---|---|---|
| 5,334,890 | 8/1994 | Hardee | 327/51 |
| 5,424,986 | 6/1995 | McClure | 365/226 |
| 5,602,793 | 2/1997 | Tomishima et al. | 365/226 |

OTHER PUBLICATIONS

"A 65-ns 4-Mbit CMOS DRAM with a Twisted Driveline Sense Amplifier" by Katsutaka Kimura et al., *Journal of Solid-State Circuits*, vol. sc–22, No. 5, Oct. 1987.

*Primary Examiner*—Toan Tran
*Attorney, Agent, or Firm*—Fleshner & Kim

[57] ABSTRACT

A sense amplifier power supply circuit for supplying a power source to a sense amplifier of a semiconductor memory device having two or more memory cell blocks is disclosed including a first power closed circuit for connecting a first power voltage line to a second ground voltage line, a second power closed circuit for connecting a first ground voltage line to a second power voltage line, a first switching transistor for supplying a power voltage to the first power closed circuit, a second switching transistor for supplying a ground voltage to the second power closed circuit, a third switching transistor for supplying the power voltage to the second power closed circuit, and a fourth switching transistor for supplying the ground voltage line to the first power closed circuit. The first power voltage and the first ground voltage line respectively supply the power voltage and the ground voltage to operate sense amplifiers of a first memory cell array; the second power voltage line and the second ground voltage line respectively supply the power voltage and the ground voltage to operate the sense amplifiers of a second memory cell array.

5 Claims, 4 Drawing Sheets

SENSE AMPLIFIER POWER SUPPLY CIRCUIT

BACKGROUND OF THE INVENTION

The present invention relates to sense amplifier power supply circuits of semiconductor memory devices, and more particularly to a sense amplifier power supply circuit for improving the performance by rapidly supplying a power source of a sense amplifier.

Recently, the development of technology has demanded a semiconductor memory device of large capacity. A sense amplifier power supply circuit is a sense amplifier in which a power supply line is most suitably arranged in the memory device, and is used to accommodate a memory of large capacity within small size. Since a conventional sense amplifier should widely array the power supply line according to a tendency toward the large capacity of the memory, the memory device is increased in size, and has become an disadvantage in its construction.

FIG. 1 shows a conventional sense amplifier circuit. A power source is supplied to sense amplifiers by power supply lines PL(PR) and NL(NR). FIG. 2 is a voltage waveform chart of the conventional sense amplifier circuit of FIG. 1. Hereinafter, the top and bottom portions of the sense amplifier circuit of FIG. 1 will be regarded as left and right sides, respectively. In the left side of the sense amplifier circuit, a field effect transistor PMOS1 has the source connected to a power voltage Vcc, the gate connected to a signal P-SW, and the drain connected to sense amplifiers through a left PMOS cell block power supply line PL. A field effect transistor NMOS1 has the source connected to a ground voltage Vss, the gate connected to a signal N-SW, and the drain connected to the sense amplifiers through a left NMOS cell block power supply line NL.

In the right side of the sense amplifier circuit, a field effect transistor PMOS2 has the source connected to the power voltage Vcc, the gate connected to a signal /P-SW, and the drain connected to sense amplifiers through a right PMOS cell block power supply line PR. A field effect transistor NMOS2 has the source connected to the ground voltage Vss, the gate connected to a signal /N-SW, and the drain connected to the sense amplifiers through a right NMOS cell block power supply line NR.

In operation, the power source is supplied to each sense amplifier (S/A) array as follows. The power voltage Vcc is supplied through the power wiring of the power supply lines PL and PR, and the ground voltage Vss is supplied through the power wiring of the power supply lines NL and NR. That is, the transistors PMOS1 and PMOS2 respectively supply the power voltage Vcc to the power supply lines PL and PR by switching the power voltage Vcc, thereby supplying the power voltage Vcc to the entire power wiring of the sense amplifier. The transistors NMOS1 and NMOS2 respectively supply the ground voltage Vss to the power supply lines NL and NR by switching the ground voltage Vss, thereby activating the sense amplifiers of the sense amplifier array.

As shown in FIG. 2, the signal P-SW of the memory array activated by addresses is set to logic "low" from logic "high", and then, the transistor PMOS1 is turned on, supplying the power voltage Vcc to the power supply line PL. Simultaneously, the signal N-SW is set to logic "high" from logic "low", and then, the transistor NMOS1 is turned on, supplying the ground voltage Vss to the power supply line NL. Therefore, the power supply lines PL and NL are as shown in FIG. 2, and the sense amplifiers connected between the power supply lines PL and NL can begin sensing operation. The power supply lines PR and NR of an inactivated memory array are maintained at a voltage of Vcc/2 and thus the sense amplifiers connected therebetween are maintained at an inactivated state.

Thus, since the above circuit having the sense amplifier power supply lines of an open loop state supplies current for operating the sense amplifier only by the power supply lines PN and NR (or PR and NR), there occurs a voltage drop by a resistor R of the wiring in the memory device having large instantaneous current during the sensing operation. This can be represented by the following equation:

$$v(t)=i(t)\times R$$

where v(t) is a voltage drop, i(t) is instantaneous current, and R is a resistor of the power wiring.

If the voltage drop occurs, since the sensing performance of the sense amplifier is deteriorated and the operating speed is lowered. In order to maintain the voltage drop of an appropriate level, the instantaneous current i(t) or the resistor R should be small. As one method for reducing the instantaneous current i(t), the number of sense amplifiers connected to the power supply line should be reduced. However, such a method leads to an increase in the number of memory array blocks and thus the device size should be increased. A method for reducing the resistor R of the power wiring also brings about an increase in the device size.

SUMMARY OF THE INVENTION

An object of the present invention is to provide a sense amplifier power supply circuit for supplying a power voltage and a ground voltage by forming a closed loop between sense amplifier power supply lines.

In accordance with one aspect of the present invention, a sense amplifier power supply circuit for supplying a power source to a sense amplifier of a semiconductor memory device having two or more memory cell blocks includes a first power closed circuit for connecting a first power voltage line to a second ground voltage line, a second power closed circuit for connecting a first ground voltage line to a second power voltage line, a first switching transistor for supplying a power voltage to the first power closed circuit, a second switching transistor for supplying a ground voltage to the second power closed circuit, a third switching transistor for supplying the power voltage to the second power closed circuit, and a fourth switching transistor for supplying the ground voltage line to the first power closed circuit. The first power voltage and the first ground voltage line respectively supply the power voltage and the ground voltage to operate a plurality of sense amplifiers connected to each cell of a first memory cell array; the second power voltage line and the second ground voltage line respectively supply the power voltage and the ground voltage to operate a plurality of sense amplifiers connected to each cell of a second memory cell array. While the first and second switching transistors are turned on to supply the power voltage and the ground voltage to the first and second power closed circuits, respectively the third and fourth switching transistors are turned off; while the third and fourth switching transistors are turned on to supply the ground voltage and the power voltage to the first and second power closed circuits, respectively, the first and second switching transistors are turned off.

BRIEF DESCRIPTION OF THE ATTACHED DRAWINGS

DETAILED DESCRIPTION OF PREFERRED EMBODIMENT

Figure 1:
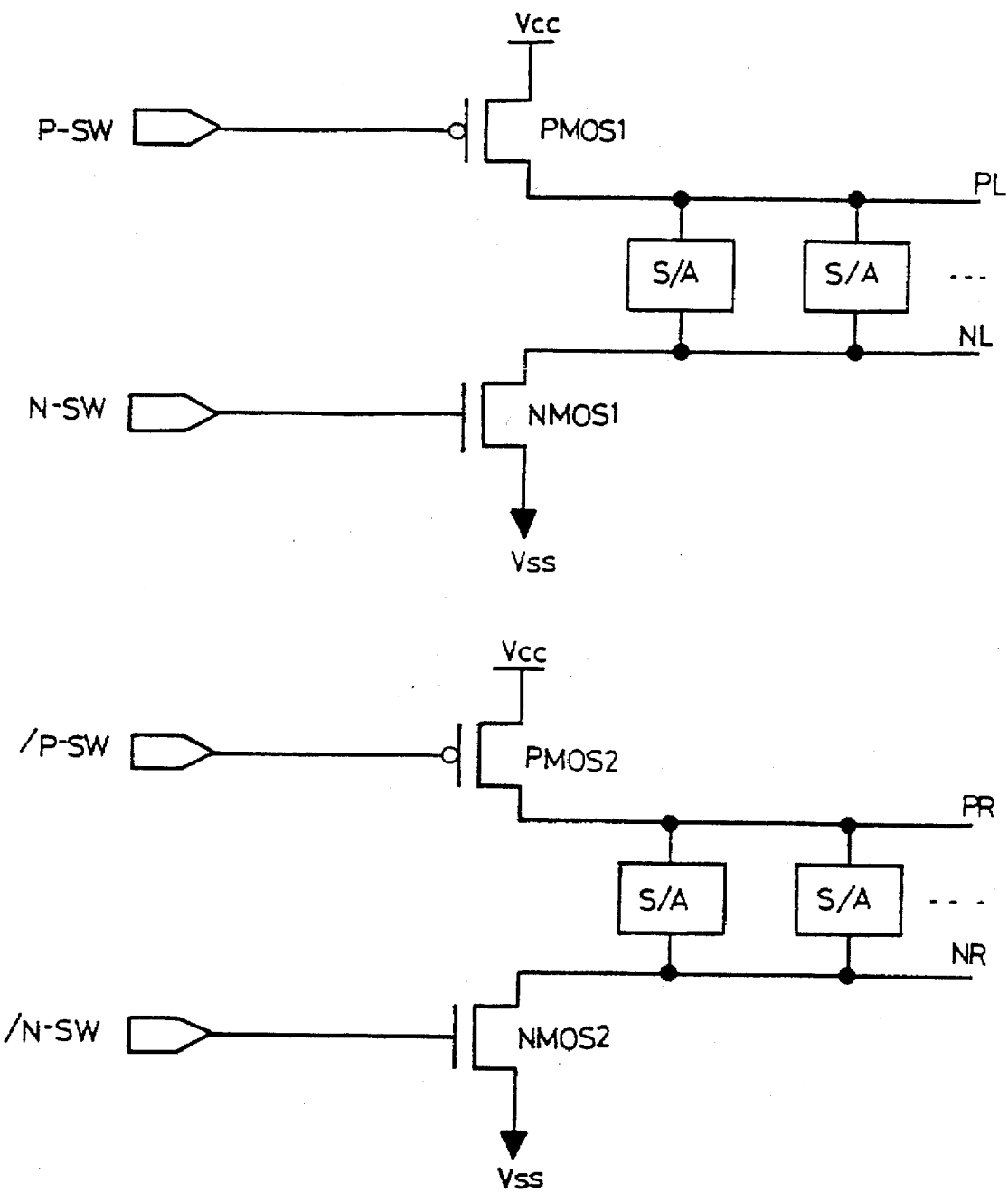
FIG. 1 is a circuit diagram of a conventional sense amplifier circuit.
Figure 2:
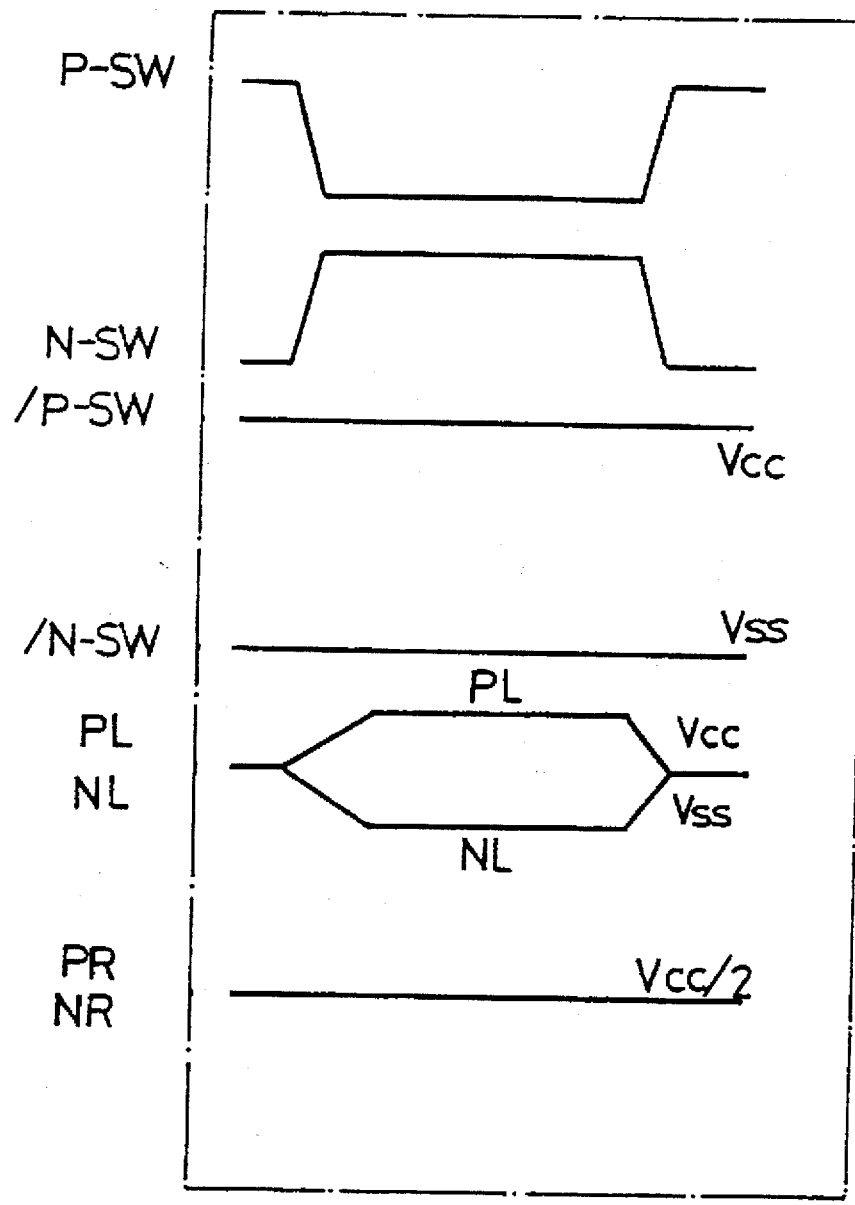
FIG. 2 is a voltage waveform chart of the sense amplifier circuit of FIG. 1.
Figure 3:
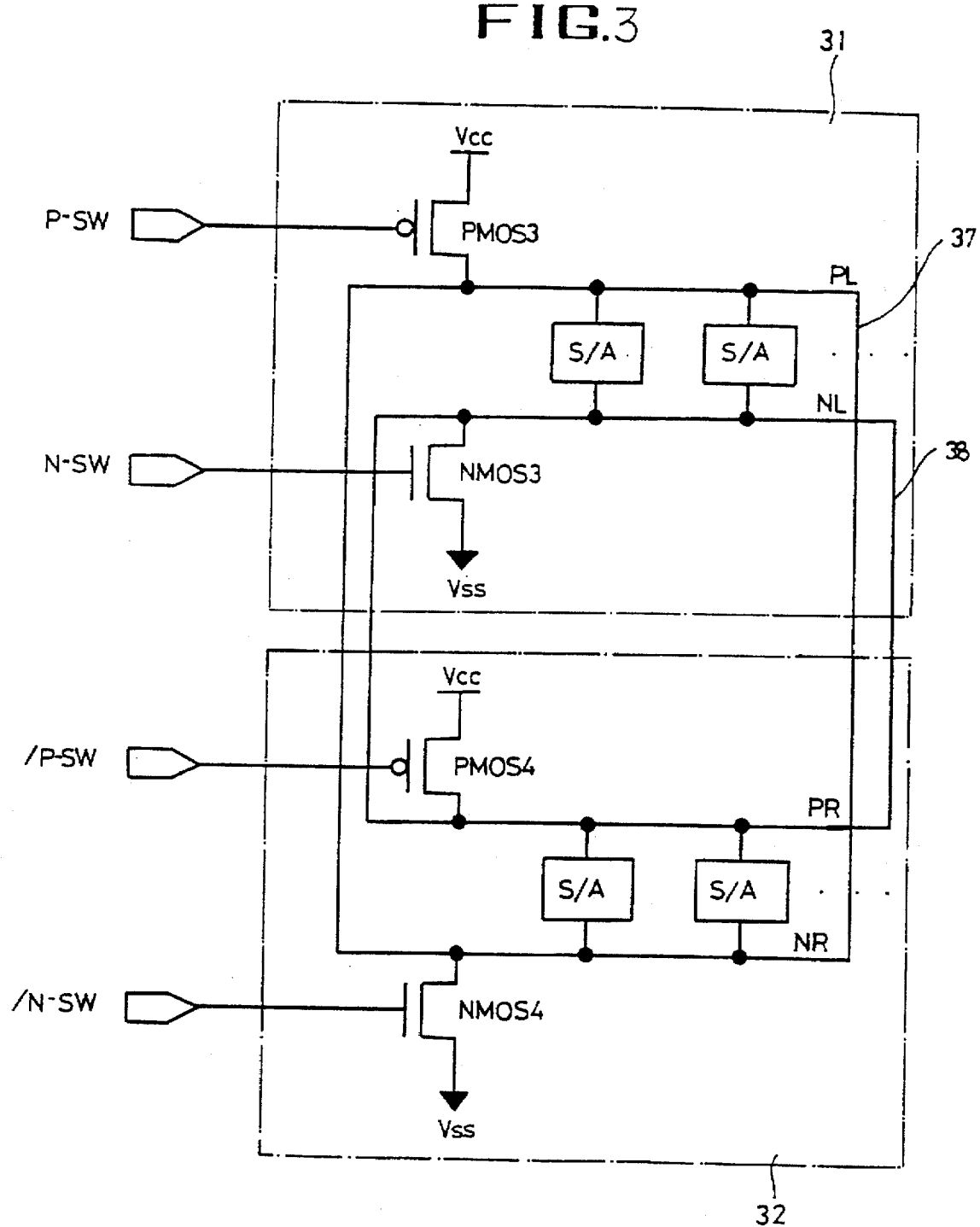
FIG. 3 is a circuit diagram of a sense amplifier power supply circuit according to the present invention.
Figure 4:
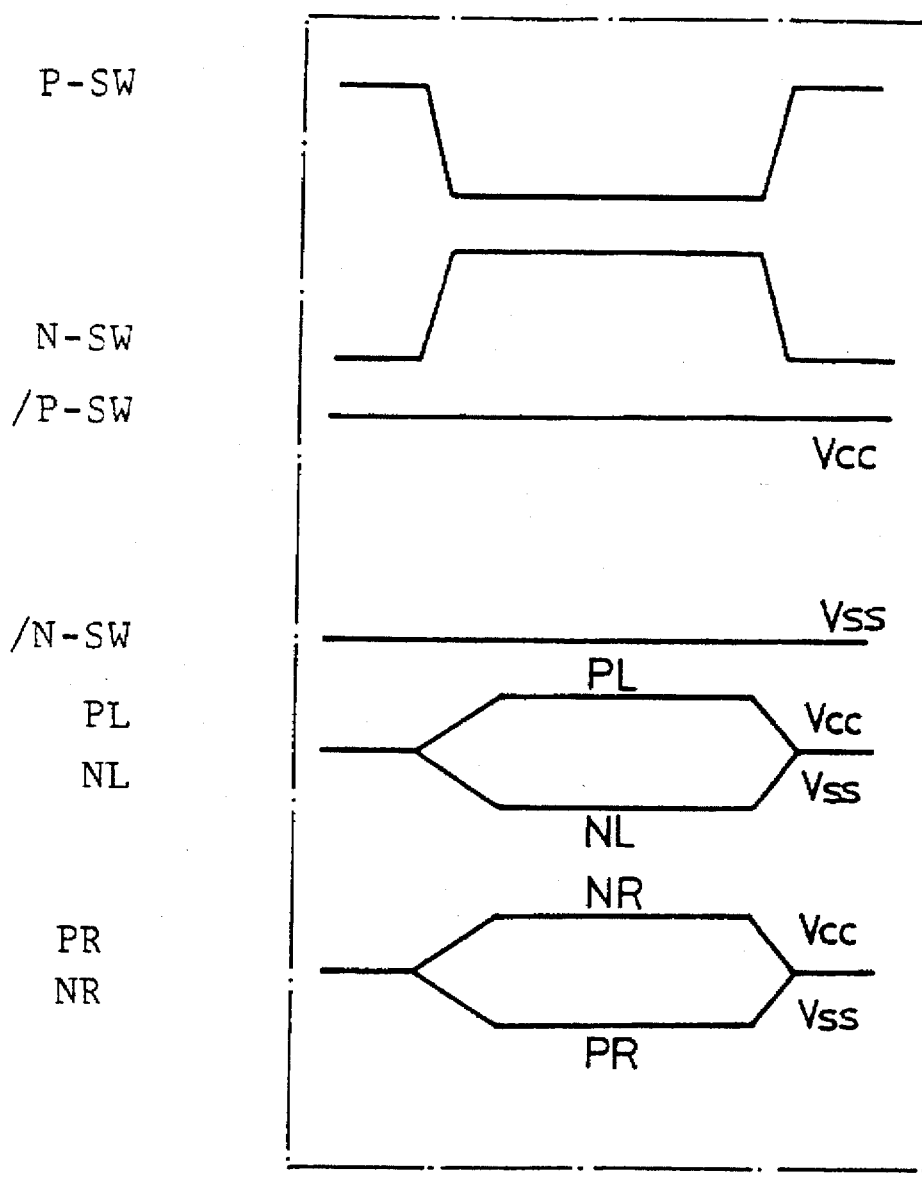
FIG. 4 is a voltage waveform chart of the sense amplifier power supply circuit of FIG. 3.

For the convenience of description, a sense amplifier power supply circuit of FIG. 3 will be regarded as being formed on first and second memory cell arrays 31 and 32. In actual, although a plurality of memory cell blocks are formed on a semiconductor memory device and the wiring for connecting one another is formed thereon, only power supply circuits and sense amplifiers will now be shown and described.

A plurality of sense amplifiers are installed on the first memory cell array 31. In order to operate the plurality of sense amplifiers, there are formed a first power voltage supply line PL for supplying a power voltage Vcc and a first ground voltage supply line NL for supplying a ground voltage Vss.

On the second memory cell array 32, a plurality of sense amplifiers are installed. In order to operate the plurality of sense amplifiers, a second power voltage supply line PR for supplying the power voltage Vcc and a second ground voltage supply line NR for supplying the ground voltage Vss are formed.

One terminal of the first power voltage supply line PL is connected to one terminal of the second ground voltage supply line NR, and the other terminal of the first power voltage supply line PL is connected to the other terminal of the second ground voltage supply line NR, thereby forming a first power closed circuit 37. One terminal of the second power voltage supply line PR is connected to one terminal of the first ground voltage supply line NL, and the other terminal of the second power voltage line PR is connected to the other terminal of the first ground voltage line NL, thereby forming a second power closed circuit 38.

A first switching transistor PMOS3 for supplying the power voltage Vcc to the first power closed circuit 37 is connected between the power voltage Vcc and the first power closed circuit 37; a second switching transistor NMOS3 for supplying the ground voltage Vss to the second power closed circuit 38 is connected between the ground voltage Vss and the second power closed circuit 38.

A third switching transistor PMOS4 for supplying the power voltage Vcc to the second power closed circuit 38 is connected between the power voltage Vcc and the second power closed circuit 38; a fourth switching transistor NMOS4 for supplying the ground voltage Vss to the first power closed circuit 37 is connected between the ground voltage Vss and the first power closed circuit 37. The first and third switching transistors are PMOS transistors; the second and fourth switching transistors are NMOS transistors. Transistors with an opposite conductivity type may be used.

Control signals by addresses for accessing the first memory cell array 31, i.e., signals obtained by decoding the addresses, are applied to the gates of the first and second switching transistors PMOS3 and NMOS3, the control signals being opposite to each other in phase. Control signals by addresses for accessing the second memory cell array 32, i.e., signals obtained by decoding the addresses, are applied to the gates of the third and fourth switching transistors PMOS4 and NMOS4, the control signals being opposite to each other in phase.

Consequently, a closed loop with a structure for sharing the power source can be formed by connecting the sense amplifiers of the first and second memory cell arrays 31 and 32 by the power wiring of opposite polarity.

The operation of the sense amplifier power supply circuit so far described will now be given.

To operate the sense amplifiers connected to the first memory cell array 31, a signal P-SW activated by the addresses for accessing cells of the first memory cell array 31 is set to logic "low" from logic "high". Then the first switching transistor PMOS3 is turned on and the power voltage Vcc is supplied to the first power voltage supply line PL. A signal N-SW is set to logic "high" from logic "low", and thus, the second switching transistor NMOS3 is turned on. The ground voltage Vss is applied to the first ground voltage supply line NL. Therefore, the sense amplifiers connected between the power voltage and ground voltage supply lines PL and NL can begin sensing operation.

Signals /P-SW and /N-SW of an inactivated memory cell array are maintained at logic "high" and logic "low", respectively. The third and fourth switching transistors PMOS4 and NMOS4 are maintained at an off state. The power voltage Vcc is supplied to the second ground voltage supply line NR connected to the first power voltage supply line PL, and the ground voltage Vss is supplied to the second power voltage supply line PR connected to the first ground supply line NL, thereby reducing a wiring resistance of the sense amplifier power supply lines. In other words, since the power voltage Vcc and the ground voltage Vss are supplied from both sides of the power voltage and ground voltage supply lines PL and NL, the current is divided to both sides thereof and the voltage drop is decreased. The sense amplifiers of the inactivated memory cell array, that is, the sense amplifiers of the second memory cell array 332 do not operate since the power source is oppositely connected.

To operate the sense amplifiers connected to the second memory cell array 32, the signal /P-SW activated by the addresses for accessing cells of the second memory cell array 31 is set to logic "low" from logic "high". Then the third switching transistor PMOS4 is turned on and the power voltage Vcc is supplied to the second power voltage supply line PR. The signal /N-SW is set to logic "high" from logic "low", and thus, the fourth switching transistor NMOS4 is turned on. The ground voltage Vss is applied to the second ground voltage supply line NR. Therefore, the sense amplifiers connected between the power voltage and ground voltage supply lines PR and NR can begin the sensing operation.

Signals P-SW and N-SW of the inactivated memory cell array are maintained at logic "high" and logic "low", respectively. The first and second switching transistors PMOS3 and NMOS3 are maintained at an off state. The power voltage Vcc is supplied to the first ground voltage supply line NL connected to the second power voltage supply line PR, and the ground voltage Vss is supplied to the first power voltage supply line PL connected to the second ground voltage supply line NR, thereby reducing the wiring resistance of the sense amplifier power supply lines. The sense amplifiers of the inactivated memory cell array do not operate since the power source is oppositely connected.

The first power closed circuit 37 is electrically connected to the sense amplifiers of the first and second memory cell arrays 31 and 32 at all times; the second power closed circuit 38 is electrically connected to the sense amplifiers of the first and second memory cell arrays 31 and 32 at all times.

As described above, the transistor is driven by the memory cell array active signal to supply the power source to the sense amplifier. There is formed the closed loop in which the power source supplied to the sense amplifiers of the first memory cell array is connected with opposite polarity to the sense amplifiers of the second memory cell array, thereby reducing the resistance and the voltage drop. Further, an increase in the size of the memory device generated by widely arranging the power wiring can be prevented.

Consequently, the sensing speed is improved by sharing the power supply wiring of the sense amplifier and greatly reducing the voltage drop in the power wiring. Moreover, since the wiring width can be reduced at the same sensing speed, the size of the device is decreased.

What is claimed is:

1. A sense amplifier power supply circuit, comprising:

a first power closed circuit for connecting a first power voltage line to a second ground voltage line, said first power voltage line supplying a power voltage to operate a first plurality of sense amplifiers connected to each cell of a first memory cell array, said second ground voltage line supplying a ground voltage to operate a second plurality of sense amplifiers connected to each cell of a second memory cell array;

a second power closed circuit for connecting a first ground voltage line to a second power voltage line, said first ground voltage line supplying said ground voltage to operate said first plurality of sense amplifiers connected to each cell of said first memory cell array, said second power voltage line supplying said power voltage to operate said second plurality of sense amplifiers connected to each cell of said second memory cell array;

a first switching transistor for supplying said power voltage to said first power closed circuit;

a second switching transistor for supplying said ground voltage to said second power closed circuit;

a third switching transistor for supplying said power voltage to said second power closed circuit; and a fourth switching transistor for supplying said ground voltage to said first power closed circuit;

whereby a control signal is applied to each switching transistor so that said third and fourth switching transistors are turned off when said first and second switching transistors are turned on, and said first and second switching transistors are turned off when said third and fourth switching transistors are turned on.

2. A sense amplifier power supply circuit as set forth in claim 1, wherein said first and third switching transistors are PMOS transistors, and wherein said second and fourth switching transistors are NMOS transistors.

3. A sense amplifier power supply circuit as set forth in claim 1, wherein said first power closed circuit is electrically connected to said sense amplifiers of said first and second memory cell arrays at all times.

4. A sense amplifier power supply circuit as set forth in claim 1, wherein said second power closed circuit is electrically connected to said sense amplifiers of said first and second memory cell arrays at all times.

5. A sense amplifier power supply circuit as set forth in claim 1, wherein said first and second switching transistors are turned on by addresses for accessing said first memory cell array, and wherein said third and fourth switching transistors are turned on by addresses for accessing said second memory cell array.

* * * * *